(12) United States Patent
Gupta et al.

(10) Patent No.: US 11,972,524 B2
(45) Date of Patent: Apr. 30, 2024

(54) METHOD AND SYSTEM FOR GENERATING TIGHTEST REVOLVE ENVELOPE FOR COMPUTER-AIDED DESIGN (CAD) MODEL

(71) Applicant: HCL Technologies Limited, New Delhi (IN)

(72) Inventors: Pankaj Gupta, Mumbai (IN); Rajesh Chakravarty, Mumbai (IN); Raunaq Pandya, Mumbai (IN); Mohsin Mulla, Pune (MH)

(73) Assignee: HCL Technologies Limited

( * ) Notice: Subject to any disclaimer, the term of this patent is extended or adjusted under 35 U.S.C. 154(b) by 0 days.

(21) Appl. No.: 17/543,787

(22) Filed: Dec. 7, 2021

(65) Prior Publication Data

US 2023/0377262 A1    Nov. 23, 2023

(51) Int. Cl.
*G06T 17/00*    (2006.01)
*G06F 30/10*    (2020.01)
*G06T 17/10*    (2006.01)

(52) U.S. Cl.
CPC ............. *G06T 17/10* (2013.01); *G06F 30/10* (2020.01)

(58) Field of Classification Search
CPC ................................ G06T 17/10; G06F 30/10
See application file for complete search history.

(56) References Cited

U.S. PATENT DOCUMENTS

| 10,776,841 | B2 | 9/2020 | Herrman et al. | |
| 11,043,026 | B1* | 6/2021 | Fathi | G06N 20/00 |
| 2002/0015934 | A1* | 2/2002 | Rubbert | A61C 7/146 433/29 |
| 2006/0012597 | A1* | 1/2006 | Chakraborty | G06T 17/005 345/419 |

(Continued)

FOREIGN PATENT DOCUMENTS

| CN | 110009743 A | 7/2019 |
| CN | 110544292 A * | 12/2019 |

(Continued)

OTHER PUBLICATIONS

Markelj, P., Tomaževič, D., Likar, B., & Pernuš, F. (2012). A review of 3D/2D registration methods for image-guided interventions. Medical image analysis, 16(3), 642-661.*

(Continued)

*Primary Examiner* — Sarah Lhymn

(57) ABSTRACT

This disclosure relates to method and system for generating tightest revolve envelope for a Boundary representation (B-rep) Computer-Aided Design (CAD) model. The method includes receiving a 2-dimensional (2D) point cloud within an XY-plane corresponding to each of a plurality of faces of the B-rep CAD model within an XYZ-space. The method further includes, for each of the plurality of faces, determining a concave hull shape for the 2D point cloud through a concave hull algorithm. The method further includes combining the concave hull shape corresponding to each of the plurality of faces of the B-rep CAD model through at least (Continued)

one of a Boolean operation and a stitching operation to obtain a tightest revolve profile of the B-rep CAD model. The method further includes revolving the tightest revolve profile about X-axis of the XYZ-space to obtain a tightest revolve envelope corresponding to the B-rep CAD model.

20 Claims, 8 Drawing Sheets

(56) References Cited

U.S. PATENT DOCUMENTS

| | | | | |
|---|---|---|---|---|
| 2013/0231892 | A1* | 9/2013 | Franke | G01B 11/0616 702/170 |
| 2015/0062117 | A1* | 3/2015 | Reitmayr | G06T 15/00 345/419 |
| 2020/0211276 | A1* | 7/2020 | Mehr | G06T 17/10 |
| 2020/0242835 | A1 | 7/2020 | Cherukuri | |
| 2020/0250894 | A1* | 8/2020 | Mehr | G06N 3/08 |
| 2020/0327727 | A1* | 10/2020 | Lieutier | G06T 7/50 |
| 2021/0279950 | A1* | 9/2021 | Phalak | G06T 7/55 |
| 2022/0219402 | A1* | 7/2022 | Neill | B22F 12/33 |

FOREIGN PATENT DOCUMENTS

| | | |
|---|---|---|
| CN | 110544292 A | 12/2019 |
| CN | 111382485 A | 7/2020 |

OTHER PUBLICATIONS

Marinov, M., Amagliani, M., Barback, T., Flower, J., Barley, S., Furuta, S., . . . & Wolski, P. (2019). Generative design conversion to editable and watertight boundary representation. Computer-Aided Design, 115, 194-205.*

Zhuang, Y., Goldberg, K., & Pickett, M. (Apr. 1997). Simplifying complex CAD geometry with conservative bounding contours. In Proceedings of international conference on robotics and automation (vol. 3, pp. 2503-2508). IEEE.*

Kim, S., Lee, K., Hong, T., Kim, M., Jung, M., & Song, Y. (Jun. 2005). An integrated approach to realize multi-resolution of B-rep model. In Proceedings of the 2005 ACM symposium on Solid and physical modeling (pp. 153-162).*

Gerald Davis; Machined-Part Modeling in 3-D CAD; The Fabricator (https://www.thefabricator.com/thefabricator/article/shopmanagement/machined-part-modeling-in-3-d-cad); May 1, 2008.

Na (alias: Dkrenfrow, Cygnus X-1, and Warrenb); Thread: Revolved Boss/Base; CNC Zone (https://www.cnczone.com/forums/solidworks/332582-revolved-boss-base.html); Mar. 31, 2017.

* cited by examiner

METHOD AND SYSTEM FOR GENERATING TIGHTEST REVOLVE ENVELOPE FOR COMPUTER-AIDED DESIGN (CAD) MODEL

TECHNICAL FIELD

This disclosure relates generally to Computer-Aided Design (CAD), and more particularly to method and system for generating tightest revolve envelope for a CAD Boundary representation (B-rep) model.

BACKGROUND

Solid modeling is a term that refers to a set of techniques that may be used to create and store computer-based representations of physical objects. Several techniques have evolved over the years for providing computer-based representations of 3-dimensional (3D) parts. One of these techniques is Boundary Representation (B-rep).

A B-rep model of a mechanical part consists of a plurality of faces, a plurality of edges and a plurality of vertices, which are connected to form a topological structure of the mechanical part. By using such a representation, it is possible to evaluate many properties of the mechanical part from a computer model. B-rep based computer models may be cut and examined in a manner like a real part. Turning is a form of machining, a material removal process, which is used to create rotational, typically axi-symmetric, parts by cutting away unwanted material. In turning, raw material is a piece of stock. The stock is available in a variety of shapes such as solid cylindrical bars and hollow tubes.

A revolve envelope of a solid model is the rotational, axi-symmetric region that encloses the solid model. Size of the revolve envelope has a direct bearing on choice of stock size for turning operation. Smaller the stock size, lower the material cost, production cost, and tooling cost. Therefore, it is imperative to compute tightest revolve envelope of a solid model to minimize costs.

The conventional technqiues fail to provide for methods to optimally determine the tightest revolve envelope for a model. In the present scenario, stock sizes are not optimized leading to wastage of stock material and higher production costs. There is, therefore, a need in the present state of art for techniques to determine tightest revolve envelopes corresponding to B-rep solid models.

SUMMARY

In one embodiment, a method for generating tightest revolve envelope for a Boundary representation (B-rep) Computer-Aided Design (CAD) model is disclosed. In one example, the method includes receiving a 2-dimensional (2D) point cloud within an XY-plane corresponding to each of a plurality of faces of the B-rep CAD model within an XYZ-space. The 2D point cloud includes a plurality of discrete 2D data points within the XY-plane. The method further includes, for each of the plurality of faces of the B-rep CAD model, determining a concave hull shape for the 2D point cloud through a concave hull algorithm. The method further includes combining the concave hull shape corresponding to each of the plurality of faces of the B-rep CAD model through at least one of a Boolean operation and a stitching operation to obtain a tightest revolve profile of the B-rep CAD model. The method further includes revolving the tightest revolve profile about X-axis of the XYZ-space to obtain a tightest revolve envelope corresponding to the B-rep CAD model.

In one embodiment, a system for generating tightest revolve envelope for a B-rep CAD model is disclosed. In one example, the system includes a processor and a computer-readable medium communicatively coupled to the processor. The computer-readable medium store processor-executable instructions, which, on execution, cause the processor to receive a 2D point cloud within an XY-plane corresponding to each of a plurality of faces of the B-rep CAD model within an XYZ-space. The 2D point cloud includes a plurality of discrete 2D data points within the XY-plane. The processor-executable instructions, on execution, further cause the processor to, for each of the plurality of faces of the B-rep CAD model, determine a concave hull shape for the 2D point cloud through a concave hull algorithm. The processor-executable instructions, on execution, further cause the processor to combine the concave hull shape corresponding to each of the plurality of faces of the B-rep CAD model through at least one of a Boolean operation and a stitching operation to obtain a tightest revolve profile of the B-rep CAD model. The processor-executable instructions, on execution, further cause the processor to revolve the tightest revolve profile about X-axis of the XYZ-space to obtain a tightest revolve envelope corresponding to the B-rep CAD model.

In one embodiment, a non-transitory computer-readable medium storing computer-executable instructions for generating tightest revolve envelope for a B-rep CAD model is disclosed. In one example, the stored instructions, when executed by a processor, cause the processor to perform operations including receiving a 2D point cloud within an XY-plane corresponding to each of a plurality of faces of the B-rep CAD model within an XYZ-space. The 2D point cloud includes a plurality of discrete 2D data points within the XY-plane. The operations further include, for each of the plurality of faces of the B-rep CAD model, determining a concave hull shape for the 2D point cloud through a concave hull algorithm. The operations further include combining the concave hull shape corresponding to each of the plurality of faces of the B-rep CAD model through at least one of a Boolean operation and a stitching operation to obtain a tightest revolve profile of the B-rep CAD model. The operations further include revolving the tightest revolve profile about X-axis of the XYZ-space to obtain a tightest revolve envelope corresponding to the B-rep CAD model.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

DETAILED DESCRIPTION

Exemplary embodiments are described with reference to the accompanying drawings. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims.

Figure 1:
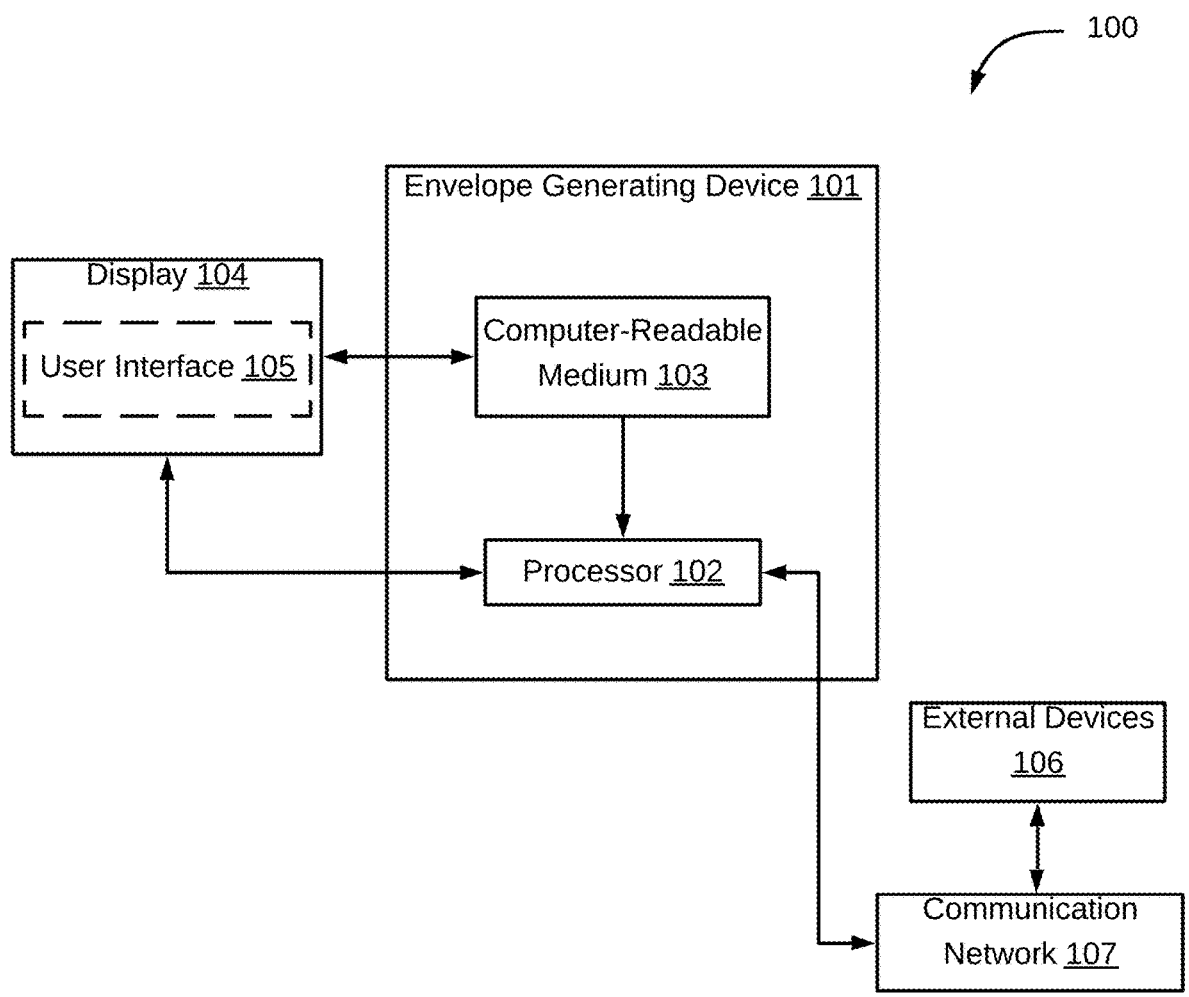
FIG. 1 is a block diagram of an exemplary system for generating tightest revolve envelope for a Boundary representation (B-rep) Computer-Aided Design (CAD) model, in accordance with some embodiments of the present disclosure.

Referring now to FIG. 1, an exemplary system 100 for generating tightest revolve envelope for a Boundary representation (B-rep) Computer-Aided Design (CAD) model is illustrated, in accordance with some embodiments of the present disclosure. The system 100 may implement an envelope generating device 101 (for example, server, desktop, laptop, notebook, netbook, tablet, smartphone, mobile phone, or any other computing device), in accordance with some embodiments of the present disclosure. The envelope generating device 101 may generate tightest revolve envelope for a B-rep CAD model by determining a tightest revolve profile of the BR-rep CAD model. It should be noted that, in some embodiments, the envelope generating device 101 may determine a concave hull shape for each of a plurality of faces of the B-rep CAD model to identify the tightest revolve envelope.

As will be described in greater detail in conjunction with FIGS. 2-6A-B, the envelope generating device may receive a 2D point cloud within an XY-plane corresponding to each of a plurality of faces of the B-rep CAD model within an XYZ-space. The 2D point cloud includes a plurality of discrete 2D data points within the XY-plane. The envelope generating device may further, for each of the plurality of faces of the B-rep CAD model, determine a concave hull shape for the 2D point cloud through a concave hull algorithm. The envelope generating device may further combine the concave hull shape corresponding to each of the plurality of faces of the B-rep CAD model through at least one of a Boolean operation and a stitching operation to obtain a tightest revolve profile of the B-rep CAD model. The envelope generating device may further revolve the tightest revolve profile about X-axis of the XYZ-space to obtain a tightest revolve envelope corresponding to the B-rep CAD model.

In some embodiments, the envelope generating device 101 may include one or more processors 102 and a computer-readable medium 103 (for example, a memory). The computer-readable medium 103 may include the B-rep CAD model. Further, the computer-readable storage medium 103 may store instructions that, when executed by the one or more processors 102, cause the one or more processors 102 to generate the tightest revolve envelope for the B-rep CAD model, in accordance with aspects of the present disclosure. The computer-readable storage medium 103 may also store various data (for example, 3D point cloud, 2D point cloud, concave hull shape corresponding to each of the plurality of faces of the B-rep CAD model, tightest revolve profile, and the like) that may be captured, processed, and/or required by the system 100.

The system 100 may further include a display 104. The system 100 may interact with a user via a user interface 105 accessible via the display 104. The system 100 may also include one or more external devices 106. In some embodiments, the PII tracking device 101 may interact with the one or more external devices 106 over a communication network 107 for sending or receiving various data. The external devices 106 may include, but may not be limited to, a remote server, a digital device, or another computing system.

Figure 2:
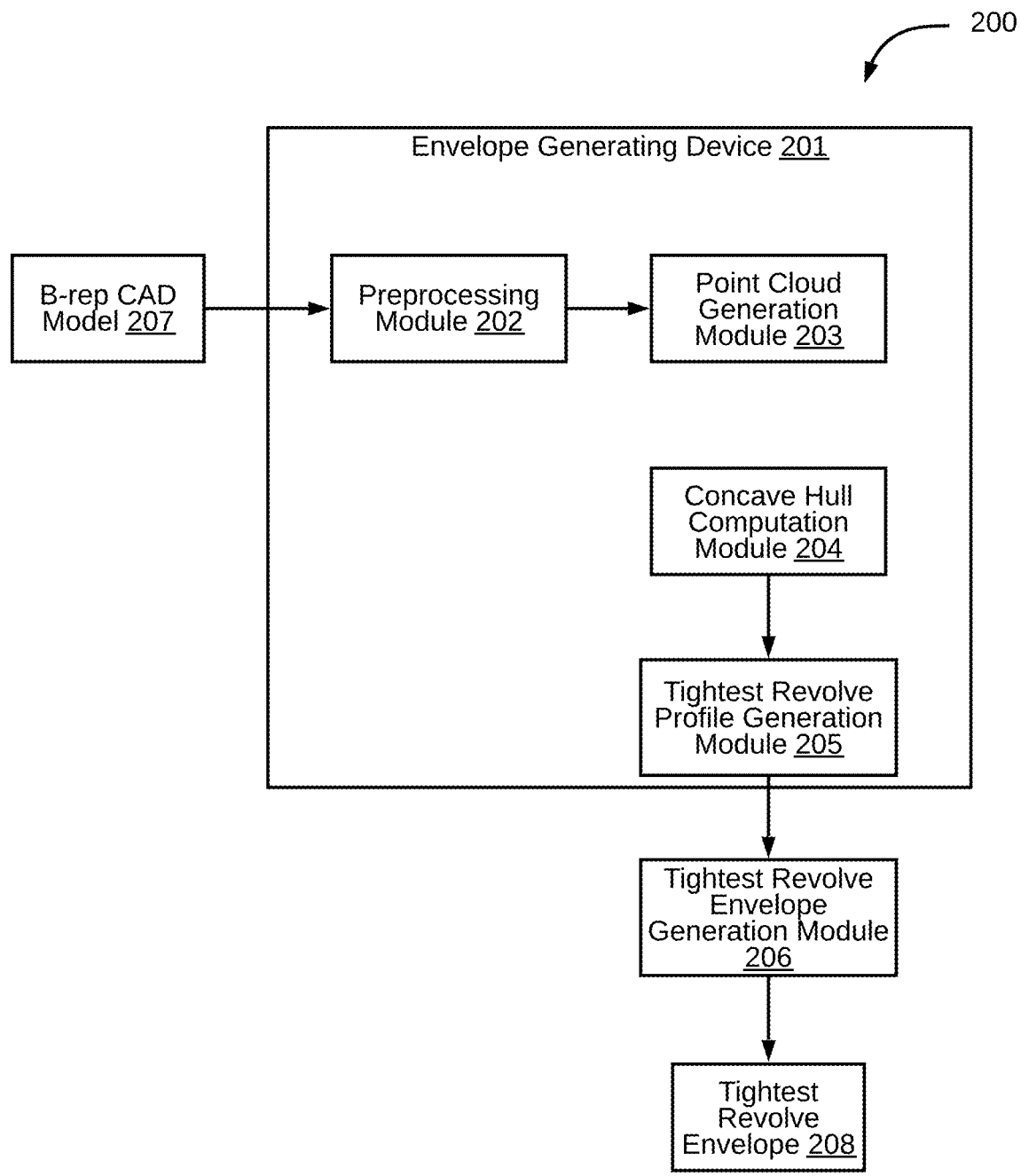
FIG. 2 illustrates a functional block diagram of an exemplary system for generating tightest revolve envelope for a B-rep CAD model, in accordance with some embodiments of the present disclosure.

Referring now to FIG. 2, functional block diagram of an exemplary system 200 for generating tightest revolve envelope for a B-rep CAD model is illustrated, in accordance with some embodiments of the present disclosure. The system 200 includes an envelope generating device 201. In an embodiment, the envelope generating device 201 is analogous to the envelope generating device 101 of the system 100. The envelope generating device 201 includes a preprocessing module 202, a point cloud generation module 203, a concave hull computation module 204, a tightest revolve profile generation module 205, and a tightest revolve envelope generation module 206.

The preprocessing module 202 receives a B-rep CAD model 207 as an input from a user. The B-rep CAD model 207 includes a plurality of faces. It may be noted that the B-rep CAD model 207 may be along a first orientation within XYZ-space. Further, the preprocessing module 202 realigns the B-rep CAD model 207 along a second orientation. In an embodiment, the second orientation is along X-axis of global coordinate system. The second orientation is achieved by a set of transformations stored for later use. Further, the preprocessing module 202 identifies one or more void regions of the B-rep CAD model 207 which are not involved in generating the tightest revolve envelope (such as, depressions). The one or more void regions are stored as a cluster of faces. Further, the one or more void regions are skipped from further processing. As will be appreciated, skipping the one or more void regions from further processing increases stability and robustness and improves the performance of the system 200. Further, the preprocessing module 202 sends the B-rep CAD model 207 to the point cloud generation module 203.

The point cloud generation module 203 receives the B-rep CAD model 207 along the second orientation from the preprocessing module 202. The point cloud generation module 203 generates a 3D point cloud for each of the plurality of faces of the B-rep CAD model 207 along the second orientation. It may be noted that the 3D point cloud includes a plurality of discrete 3D data points within the XYZ-space. Edges of each of the plurality of faces are discretized. Further, interior of each of the plurality of faces is discretized to obtain the 3D point cloud. Granularity of discretization is controlled by a user-defined parameter. When the user-defined parameter is not provided by user, the parameter is internally initialized to a value based on heuristics. It may be noted that discretizing algorithm identifies critical points (maxima and minima of distance function) from the plurality of discrete 3D data points required for an accurate radial projection of a face onto a plane (such as, XY-plane).

Mathematically, a radial projected point, $P_r$, of a given point, P, about an axis on a plane is determined through following equation:

$$P_r = P_a + R*D \quad (1)$$

where, $P_a$ is closest point of P on user input axis;
R is magnitude of a vector joining $P_a$ to P, i.e., $R=|P-P_a|$;
D is a unit vector defined by a cross product of axis direction and plane normal through the axis, i.e., $D=(A_d*N_p)$;
$A_d$ is a unit vector depicting user input axis direction; and
$N_p$ is a unit vector defining a normal of a plane passing through the user input axis.

In an embodiment, the plane used for radial projection is the XY-plane. Radially projecting each point of the 3D point cloud corresponding to the face results into a 2D point cloud of radially projected points lying on the XY-plane. Further, the 2D point cloud is sent to the concave hull computation module 204.

The concave hull computation module 204 receives the 2D point cloud of the face from the point cloud generation module 203. The concave hull computation module 204 determines a concave hull shape for the 2D point cloud through a concave hull algorithm. The concave hull computation module 204 identifies a set of boundary points of the 2D point cloud through the concave hull algorithm. It may be noted that the set of boundary points define a boundary of the face. Further, the concave hull computation module 204 estimates a concave hull shape based on the set of boundary points. The set of boundary points is joined appropriately to capture a true shape of the radially projected face.

A concave hull creation algorithm is based on nearest neighbors' approach. The concave hull computation module 204 takes the 2D point cloud on XY-plane as an input and provides a point list as an output. The point list, when connected in sequence, generates an envelope that optimally encloses the 2D point cloud. The concave hull computation module 204 initializes with a first point. The first point is a minimum Y point, i.e., a point from the 2D point cloud with minimum Y co-ordinate value. Further, the concave hull computation module 204 finds a second point with a maximum right hand turn angle with a reference vector from among nearest set of neighboring points. Further, the concave hull computation module 204 adds the second point to the concave hull and removes the point from the 2D point cloud. Similarly, remaining points are collected till the first point is reached. In some embodiments, checks are maintained while adding points to the concave hull to avoid creating a self-intersecting concave hull. Upon creating the concave hull, the concave hull computation module 204 checks whether remaining points in the 2D point cloud are inside the concave hull. When one or more of the remaining points are outside the concave hull, it is established that the concave hull is not enclosing the 2D point cloud and the concave hull creation algorithm is repeated by taking a bigger set of nearest neighbor points.

Upon generating the set of boundary points, the concave hull computation module 204 fits the set of boundary points to capture a true shape of the radially projected face. As will be appreciated, a purely sequential joining of the set of boundary points with a line segment may result in a polygonal shaped concave hull. The polygonal shape is simple, but generally not desirable due to large approximation error and robustness issues of downline operations. An algorithm based on intelligent criteria/heuristics may collect a suitable set of points to fit with a curve which may capture the true shape of the radially projected face. In an exemplary scenario, the face in the B-rep CAD model 207 is a revolve surface with axis matching the user input axis. In such a scenario, shape of a radially projected image of the face is an open curve and not enclosing an area. Further, the concave hull computation module 204 sends the concave hull shape to the tightest revolve profile generation module 205.

The tightest revolve profile generation module 205 receives the concave hull shape from the concave hull computation module 204. The tightest revolve profile generation module 205 combines the concave hull shape corresponding to each of the plurality of faces of the B-rep CAD model 207 through at least one of a Boolean operation and a stitching operation to obtain a tightest revolve profile of the B-rep CAD model 207. The tightest revolve profile is obtained by adding up the radially projected profile of each of the plurality of faces of the B-rep CAD model 207 followed by obtaining a boundary of unified profile. Unification of profiles starts with filtering out of closed profiles and open profiles. The closed profiles are combined first. Further, the tightest revolve profile generation module 205 checks interaction between two profiles to decide on an addition operation. When the two profiles inter-penetrate, the addition operation is achieved by the Boolean operation. When the two profiles touch or overlap, the addition operation is achieved by stitching or sewing operation.

In some embodiments, the tightest revolve profile generation module 205 may handle near touching scenarios arising due to numerical noise, small approximations, tolerant models, or the like. The tightest revolve profile generation module 205 applies concept of Hausdorff distance to identify a potential profile pair to add. Further, the tightest revolve profile generation module 205 edits the potential profile pair, by adding suitable vertices in one or both profiles, to make the potential profile pair compatible. Further, the tightest revolve profile generation module 205 finally combines the potential profile pair by stitching/sewing operation. In some embodiments, intelligent optimizations are added to skip the addition operation when one profile is completely enclosed inside other profile. When each of the closed profiles is processed, the tightest revolve profile generation module 205 starts working on the open profiles in a similar manner as with closed profiles.

When each of the closed profiles and the open profiles is processed for the addition operation, the tightest revolve profile generation module 205 checks whether the unified profile is closed or open. When the unified profile is open, line segments are appropriately added to close the unified profile. Further, the tightest revolve profile generation module 205 proceeds to simplify the unified profile based on relaxed curvature continuity criteria to merge out edges resulting into a simplified closed profile. Further, the tightest revolve profile generation module 205 sends the simplified closed profile to the tightest revolve envelope generation module 206.

The tightest revolve envelope generation module 206 receives the simplified closed profile the tightest revolve profile generation module 205. Further, the tightest revolve envelope generation module 206 revolves the simplified closed profile about the X-axis to generate a revolve model which is tightest revolve envelope 208 of the B-rep CAD model 207. Further, the tightest revolve envelope generation module 206 realigns the B-rep CAD model 207 and the associated tightest revolve envelope 208 along the first orientation.

It should be noted that all such aforementioned modules 202-206 may be represented as a single module or a combination of different modules. Further, as will be appreciated by those skilled in the art, each of the modules 202-206 may reside, in whole or in parts, on one device or multiple devices in communication with each other. In some embodiments, each of the modules 202-206 may be implemented as dedicated hardware circuit comprising custom application-specific integrated circuit (ASIC) or gate arrays, off-the-shelf semiconductors such as logic chips, transistors, or other discrete components. Each of the modules 202-206 may also be implemented in a programmable hardware device such as a field programmable gate array (FPGA), programmable array logic, programmable logic device, and so forth. Alternatively, each of the modules 202-206 may be implemented in software for execution by various types of processors (e.g., processor 102). An identified module or executable code may, for instance, include one or more physical or logical blocks of computer instructions, which may, for instance, be organized as an object, procedure, function, or other construct. Nevertheless, the executables of an identified module or component need not be physically located together, but may include disparate instructions stored in different locations which, when joined logically together, include the module and achieve the stated purpose of the module. Indeed, a module of executable code could be a single instruction, or many instructions, and may even be distributed over several different code segments, among different applications, and across several memory devices.

As will be appreciated by one skilled in the art, a variety of processes may be employed for generating tightest revolve envelope for a B-rep CAD model. For example, the exemplary system 100 and the associated envelope generating device 101 may generate tightest revolve envelope for a B-rep CAD model by the processes discussed herein. In particular, as will be appreciated by those of ordinary skill in the art, control logic and/or automated routines for performing the techniques and steps described herein may be implemented by the system 100 and the associated envelope generating device 101 either by hardware, software, or combinations of hardware and software. For example, suitable code may be accessed and executed by the one or more processors on the system 100 to perform some or all of the techniques described herein. Similarly, application specific integrated circuits (ASICs) configured to perform some or all of the processes described herein may be included in the one or more processors on the system 100.

Figure 3A:
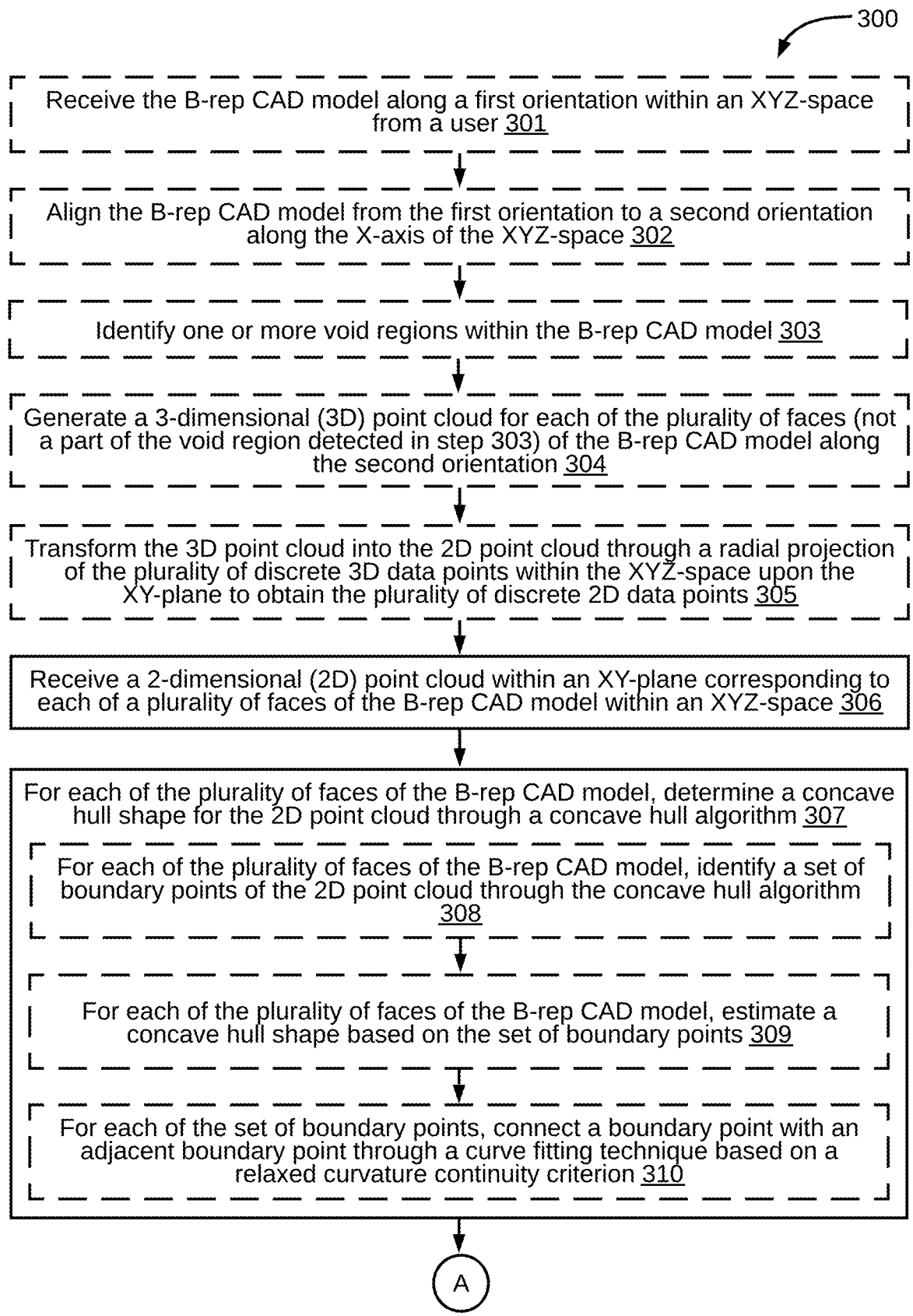
FIGS. 3A and 3B illustrate a flow diagram of an exemplary process for generating tightest revolve envelope for a B-rep CAD model, in accordance with some embodiments of the present disclosure.
Figure 3B:
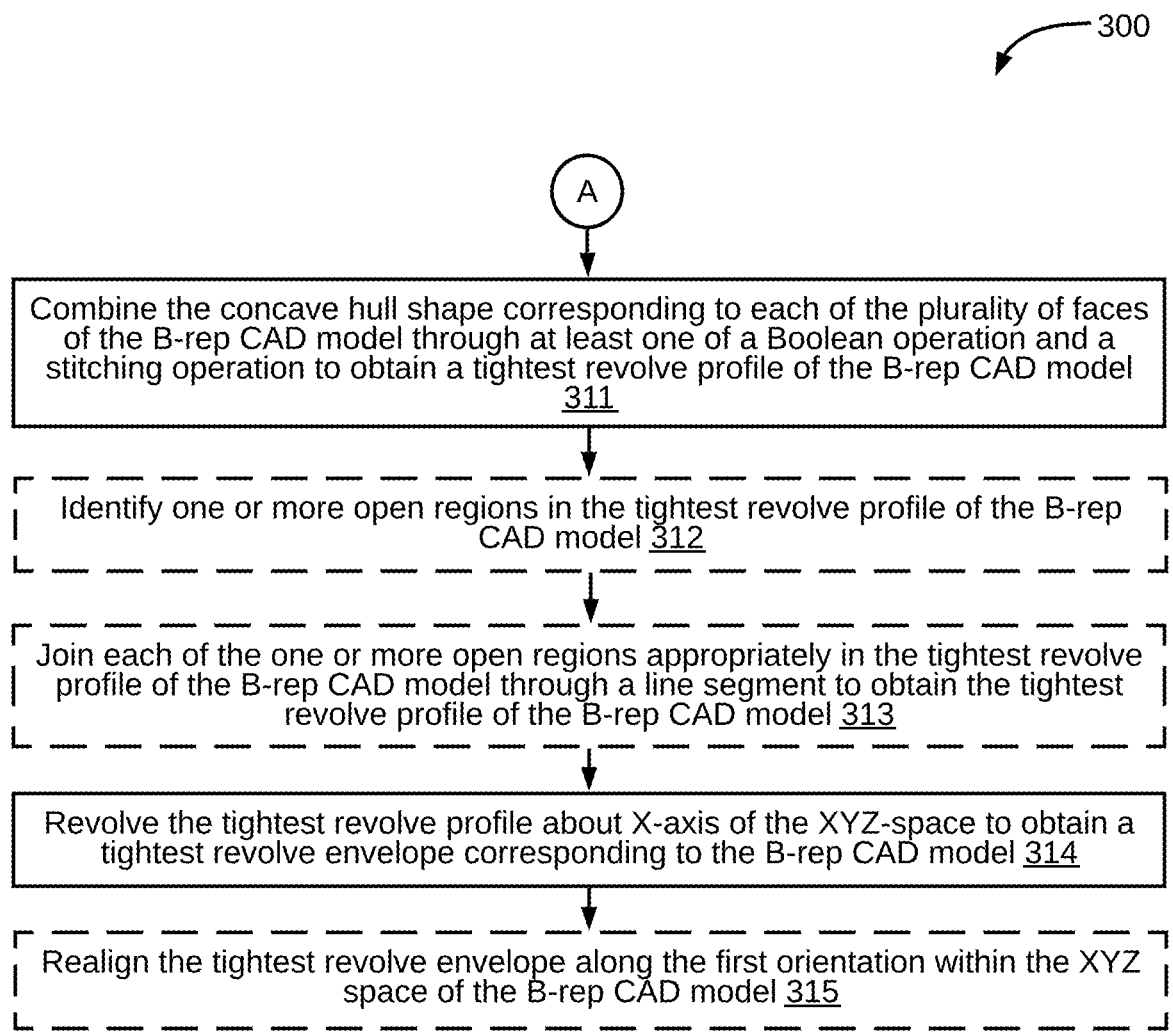

Referring now to FIG. 3, an exemplary process 300 for generating tightest revolve envelope for a B-rep CAD model is depicted via a flowchart, in accordance with some embodiments of the present disclosure. In an embodiment, the process 300 is implemented by the envelope generating device 101 of the system 100. The process 300 may be implemented by the envelope generating device 101 of the system 100. The process 300 includes receiving the B-rep CAD model along a first orientation within an XYZ-space from a user, at step 301. Further, the process 300 includes aligning the B-rep CAD model from the first orientation to a second orientation along the X-axis of the XYZ-space, at step 302. Further, the process 300 includes identifying one or more void regions within the B-rep CAD model having no role in the generation of the tightest revolve envelope of the B-rep CAD model, at step 303. The one or more void regions include a set of void discrete points.

Further, the process 300 includes generating a 3D point cloud for each of the plurality of faces of the B-rep CAD model along the second orientation, at step 304. The 3D point cloud includes a plurality of discrete 3D data points within the XYZ-space. The set of void discrete points, at step 303, is not a part of the plurality of 3D data points at step 304. Further, the process 300 includes transforming the 3D point cloud into the 2D point cloud through a radial projection of the plurality of discrete 3D data points within the XYZ-space upon the XY-plane to obtain the plurality of discrete 2D data points, at step 305. By way of an example, the preprocessing module 202 receives the B-rep CAD model 207 along the first orientation. Further, the preprocessing module 202 aligns the B-rep CAD model 207 along the second orientation (such as, the XY-plane). The preprocessing module 202 identifies one or more void regions which may not be considered for further processing. Further, the point cloud generation module 204 receives the B-rep CAD model 207. The point cloud generation module 204 generates a 3D point cloud corresponding to each of the plurality of faces of the B-rep CAD model 207. Further, the point cloud generation module 204 transforms the 3D point cloud into a 2D point cloud through radial projection of the plurality of discrete 3D data points onto the XY-plane.

Further, the process 300 includes receiving a 2-dimensional (2D) point cloud within an XY-plane corresponding to each of a plurality of faces of the B-rep CAD model within an XYZ-space, at step 306. The 2D point cloud includes a plurality of discrete 2D data points within the XY-plane. Further, the process 300 includes, for each of the plurality of faces of the B-rep CAD model, determining a concave hull shape for the 2D point cloud through a concave hull algorithm, at step 307. Further, for each of the plurality of faces of the B-rep CAD model, the process 300 includes identifying a set of boundary points of the 2D point cloud through the concave hull algorithm, at step 308. The set of boundary points is a part of the plurality of discrete 2D data points. Further, for each of the plurality of faces of the B-rep CAD model, the process 300 includes estimating a concave hull shape based on the set of boundary points, at step 309.

Further, for each of the set of boundary points, the process 300 includes connecting a boundary point with an adjacent boundary point through a curve fitting technique based on a relaxed curvature continuity criterion, at step 310. In continuation of the example above, the concave hull computation module 204 determines a concave hull shape for each of the plurality of faces of the B-rep CAD model 207 through a concave hull algorithm by identifying a set of boundary points and connecting the set of boundary points through a curve fitting technique based on a relaxed curvature continuity criterion.

Further, the process 300 includes combining the concave hull shape corresponding to each of the plurality of faces of the B-rep CAD model through at least one of a Boolean operation and a stitching operation to obtain a tightest revolve profile of the B-rep CAD model, at step 311.

Further, the process 300 includes identifying one or more open regions in the tightest revolve profile of the B-rep CAD model, at step 312. Further, the process 300 includes joining each of the one or more open regions appropriately in the tightest revolve profile of the B-rep CAD model through a line segment to obtain the tightest revolve profile of the B-rep CAD model, at step 313.

Further, the process 300 includes revolving the tightest revolve profile about X-axis of the XYZ-space to obtain a tightest revolve envelope corresponding to the B-rep CAD model, at step 314. In continuation of the example above, the tightest revolve profile generation module 205 generates the tightest revolve profile corresponding to the B-rep CAD model 207 by combining each of concave hull shapes of the plurality of faces. The combining may be performed through at least one of a Boolean operation and a stitching operation. Further, the tightest revolve profile is received by the tightest revolve envelope generation module 206. The tightest revolve envelope generation module 206 performs a revolving operation on the tightest revolve profile to generate the tightest revolve envelope 208.

Further, the process 300 includes realigning the tightest revolve envelope along the first orientation within the XYZ space of the B-rep CAD model, at step 315.

Figure 4A:
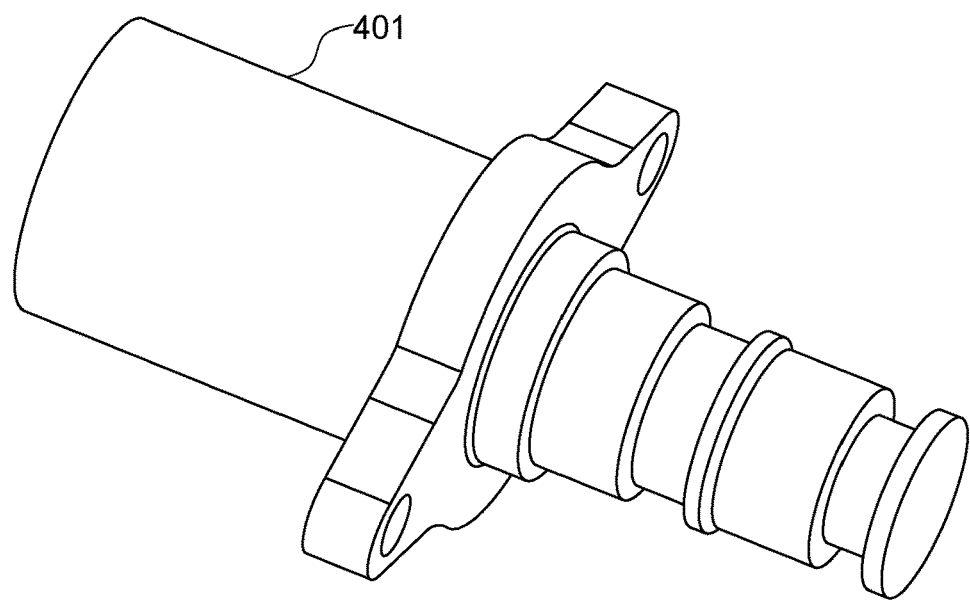
FIG. 4A and FIG. 4B illustrate a B-rep CAD model, tightest revolve profile corresponding to the B-rep CAD model, and tightest revolve envelope corresponding to the B-rep CAD model, in accordance with some embodiments of the present disclosure.
Figure 4B:
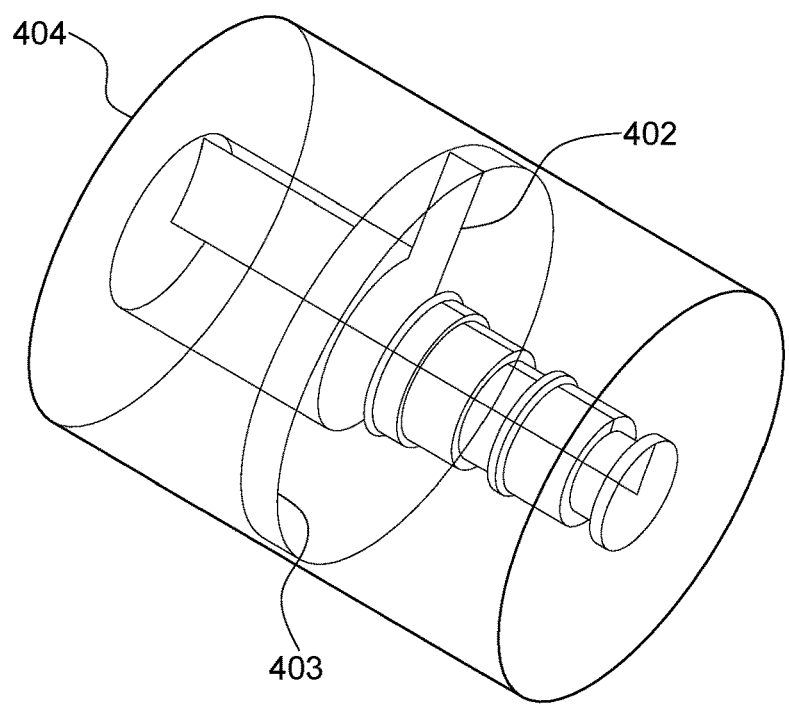

Referring now to FIG. 4A and FIG. 4B, a B-rep CAD model 401, tightest revolve profile 402 corresponding to the B-rep CAD model 401, and tightest revolve envelope 403 corresponding to the B-rep CAD model 401 are illustrated, in accordance with some embodiments of the present disclosure. The tightest revolve envelope 403 provides a lower bound on the stock size 404, for example turning machining operation, as shown in FIG. 4B. In FIG. 4A, the B-rep CAD model 401 is illustrated. The B-rep CAD model 401 includes a plurality of faces. To identify the tightest revolve envelope 403 corresponding to the B-rep CAD model 401, for each of the plurality of faces, a 3D point cloud is generated. The 3D point cloud includes a plurality of discrete 3D data points. Further, a 2D point cloud is derived from the 3D point cloud by radial projection of each of the plurality of discrete 3D data points.

Referring now to FIG. 4B, the tightest revolve profile 402 corresponding to the B-rep CAD model 401 is derived by determining a 2D concave hull shape corresponding to each of the plurality of faces of the B-rep CAD model 401 from the 2D point cloud. Further, 2D concave hull shapes corresponding to the plurality of faces of the B-rep CAD model 401 are combined through an addition operation. By way of an example, the addition operation may be a Boolean operation or a stitching operation. In an embodiment, the adding operation is performed by the tightest revolve profile generation module 205. Further, the tightest revolve envelope 403 is obtained from the tightest revolve profile 402 by performing a revolving operation on the tightest revolve profile 402. In an embodiment, the revolving operation is performed by the tightest revolve envelope generation module 206.

Figure 5A:
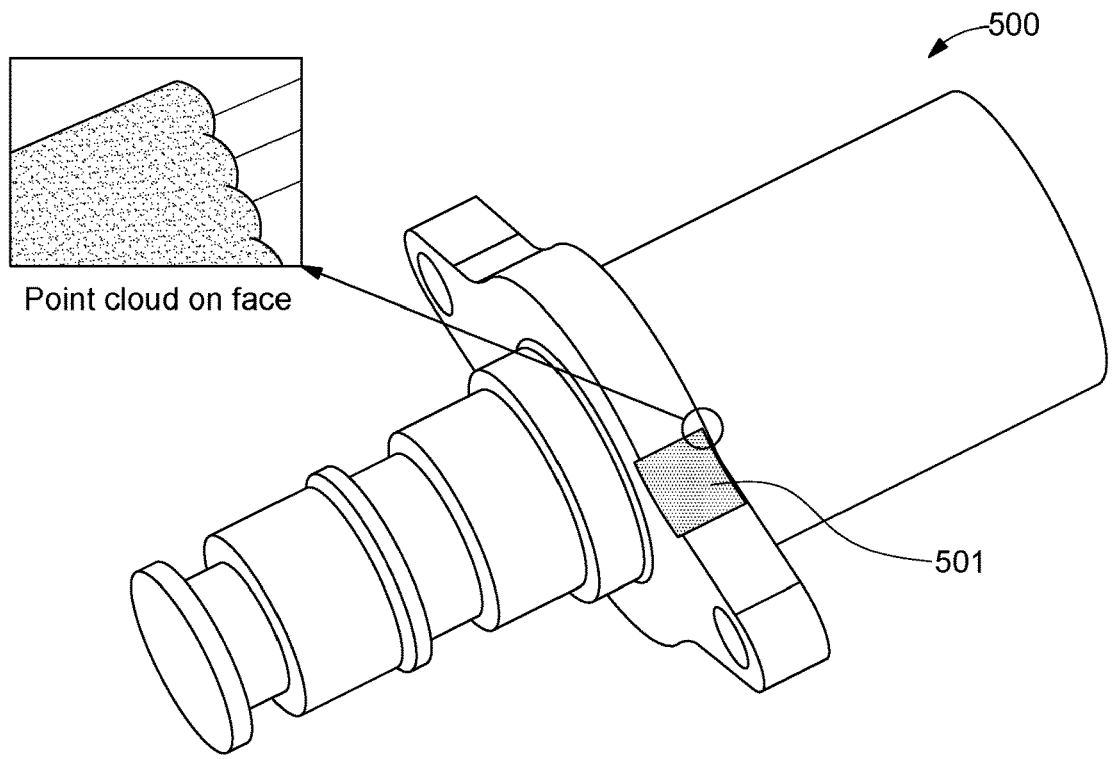
FIGS. 5A and 5B illustrate a B-rep CAD model with 3D point cloud of a face in XYZ space and its corresponding radially projected point cloud in 2D XY plane, in accordance with some embodiments of the present disclosure.
Figure 5B:
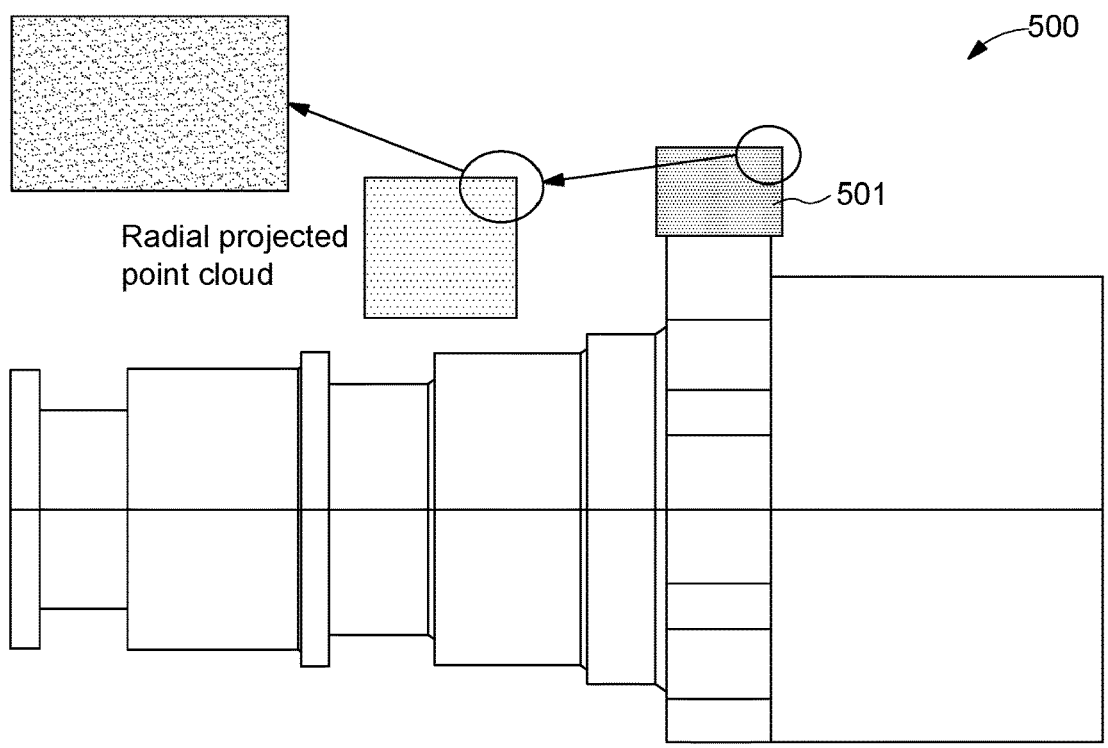

Referring now to FIGS. 5A and 5B, a B-rep CAD model 500 is illustrated, in accordance with some embodiments of the present disclosure. In FIG. 5A, the B-rep CAD model 500 is along the first orientation. It may be noted that the first orientation is provided by the user. The B-rep CAD model 500 includes a plurality of faces (such as, face 501). In FIG. 5B, the B-rep CAD model 500 is along the second orientation. In an embodiment, the second orientation is along the XY-plane. The preprocessing module 202 aligns the B-rep CAD model 500 along the second orientation. Further, the point cloud generation module 203 generates a 3D point cloud for each of the plurality of faces.

Figure 6A:
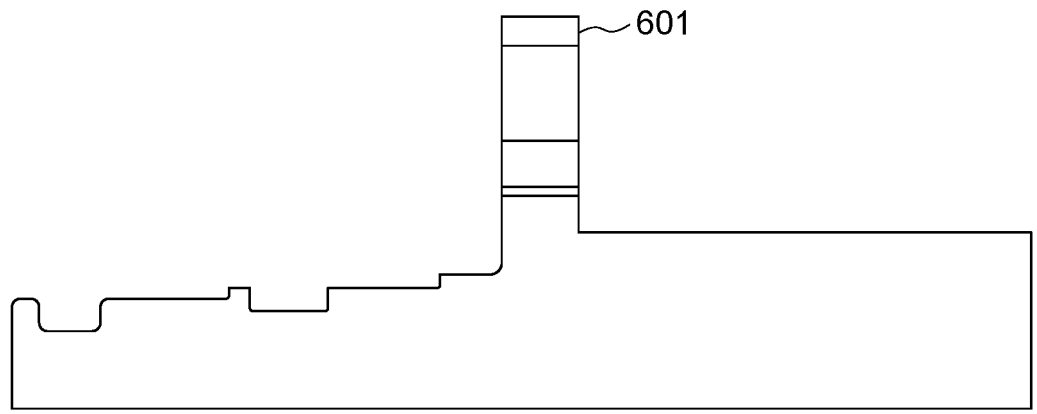
FIGS. 6A and 6B illustrate generation of tightest revolve profile from a concave hull shape corresponding to each of a plurality of faces of the B-rep CAD model, in accordance with some embodiments of the present disclosure.
Figure 6B:
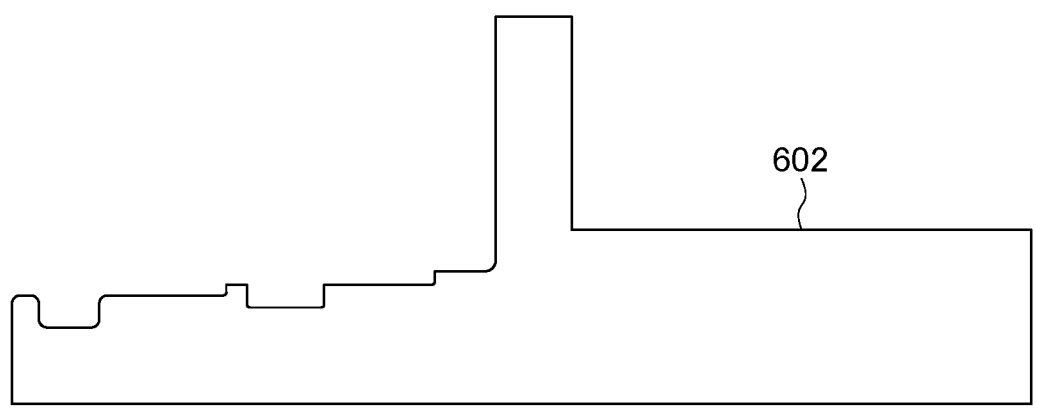

Referring now to FIGS. 6A and 6B, generation of tightest revolve profile from a concave hull shape corresponding to each of a plurality of faces of the B-rep CAD model is illustrated, in accordance with some embodiments of the present disclosure. In FIG. 6A, a concave hull shape (for example, the concave hull shape 601 corresponding to a face of the B-rep CAD model) corresponding to each of a plurality of faces of the B-rep CAD model is determined. In FIG. 6B, concave hull shapes corresponding to the plurality of faces of the B-rep CAD model are combined to form the tightest revolve profile 602 corresponding to the B-rep CAD model. The concave hull shapes are combined through an addition operation. By way of an example, the addition operation may be a Boolean operation or a stitching operation.

As will be also appreciated, the above described techniques may take the form of computer or controller implemented processes and apparatuses for practicing those processes. The disclosure can also be embodied in the form of computer program code containing instructions embodied in tangible media, such as floppy diskettes, solid state drives, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

Figure 7:
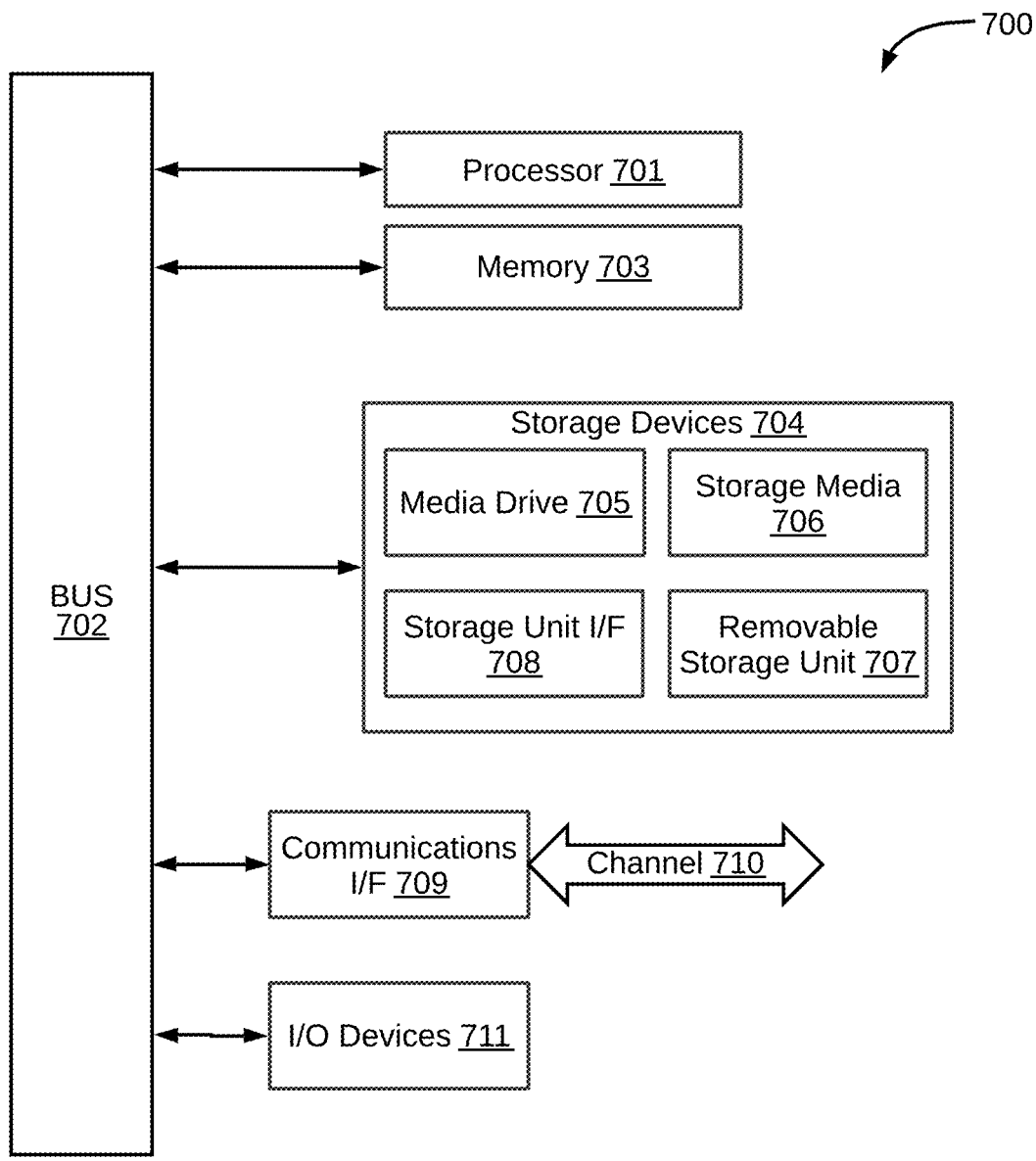
FIG. 7 is a block diagram of an exemplary computer system for implementing embodiments consistent with the present disclosure.

The disclosed methods and systems may be implemented on a conventional or a general-purpose computer system, such as a personal computer (PC) or server computer. Referring now to FIG. 7, an exemplary computing system 700 that may be employed to implement processing functionality for various embodiments (e.g., as a SIMD device, client device, server device, one or more processors, or the like) is illustrated. Those skilled in the relevant art will also recognize how to implement the invention using other computer systems or architectures. The computing system 700 may represent, for example, a user device such as a desktop, a laptop, a mobile phone, personal entertainment device, DVR, and so on, or any other type of special or general-purpose computing device as may be desirable or appropriate for a given application or environment. The computing system 700 may include one or more processors, such as a processor 701 that may be implemented using a general or special purpose processing engine such as, for example, a microprocessor, microcontroller or other control logic. In this example, the processor 701 is connected to a bus 702 or other communication medium. In some embodiments, the processor 701 may be an Artificial Intelligence (AI) processor, which may be implemented as a Tensor Processing Unit (TPU), or a graphical processor unit, or a custom programmable solution Field-Programmable Gate Array (FPGA).

The computing system 700 may also include a memory 703 (main memory), for example, Random Access Memory (RAM) or other dynamic memory, for storing information and instructions to be executed by the processor 701. The memory 703 also may be used for storing temporary variables or other intermediate information during execution of instructions to be executed by the processor 701. The computing system 700 may likewise include a read only memory ("ROM") or other static storage device coupled to bus 702 for storing static information and instructions for the processor 701.

The computing system 700 may also include a storage device 704, which may include, for example, a media drives 705 and a removable storage interface. The media drive 705 may include a drive or other mechanism to support fixed or removable storage media, such as a hard disk drive, a floppy disk drive, a magnetic tape drive, an SD card port, a USB port, a micro USB, an optical disk drive, a CD or DVD drive (R or RW), or other removable or fixed media drive. A storage media 706 may include, for example, a hard disk, magnetic tape, flash drive, or other fixed or removable medium that is read by and written to by the media drive 705. As these examples illustrate, the storage media 706 may include a computer-readable storage medium having stored there in particular computer software or data.

In alternative embodiments, the storage devices 704 may include other similar instrumentalities for allowing computer programs or other instructions or data to be loaded into the computing system 700. Such instrumentalities may include, for example, a removable storage unit 707 and a storage unit interface 708, such as a program cartridge and cartridge interface, a removable memory (for example, a flash memory or other removable memory module) and memory slot, and other removable storage units and interfaces that allow software and data to be transferred from the removable storage unit 707 to the computing system 700.

The computing system 700 may also include a communications interface 709. The communications interface 709 may be used to allow software and data to be transferred between the computing system 700 and external devices. Examples of the communications interface 709 may include a network interface (such as an Ethernet or other NIC card), a communications port (such as for example, a USB port, a micro USB port), Near field Communication (NFC), etc. Software and data transferred via the communications interface 709 are in the form of signals which may be electronic, electromagnetic, optical, or other signals capable of being received by the communications interface 709. These signals are provided to the communications interface 709 via a channel 710. The channel 710 may carry signals and may be implemented using a wireless medium, wire or cable, fiber optics, or other communications medium. Some examples of the channel 710 may include a phone line, a cellular phone link, an RF link, a Bluetooth link, a network interface, a local or wide area network, and other communications channels.

The computing system 700 may further include Input/Output (I/O) devices 711. Examples may include, but are not limited to a display, keypad, microphone, audio speakers, vibrating motor, LED lights, etc. The I/O devices 711 may receive input from a user and also display an output of the computation performed by the processor 701. In this document, the terms "computer program product" and "computer-readable medium" may be used generally to refer to media such as, for example, the memory 703, the storage devices 704, the removable storage unit 707, or signal(s) on the channel 710. These and other forms of computer-readable media may be involved in providing one or more sequences of one or more instructions to the processor 701 for execution. Such instructions, generally referred to as "computer program code" (which may be grouped in the form of computer programs or other groupings), when executed, enable the computing system 700 to perform features or functions of embodiments of the present invention.

In an embodiment where the elements are implemented using software, the software may be stored in a computer-readable medium and loaded into the computing system 700 using, for example, the removable storage unit 707, the media drive 705 or the communications interface 709. The control logic (in this example, software instructions or computer program code), when executed by the processor 701, causes the processor 701 to perform the functions of the invention as described herein.

Thus, the disclosed method and system try to overcome the technical problem of generating tightest revolve envelope for a B-rep CAD model. The method and system provide an automated mechanism to compute the tightest revolve envelope for a B-rep CAD model about a given direction. Further, the method and system provide for a robust solution that may handle any part profile (from simple to complex) and may be ported into any software based on solid modeling. Further, the method and system incorporate intelligent optimizations to reduce computational load and provide an automated mechanism to accurately predict stock size for turning operation. Further, the method and system may be used in costing domain to predict cost of manufacturing the part, packaging industry for 3D nesting of parts, and analysis domain for analysis.

As will be appreciated by those skilled in the art, the techniques described in the various embodiments discussed above are not routine, or conventional, or well understood in the art. The techniques discussed above provide for generating tightest revolve envelope for a B-rep CAD model. The techniques first receive a 2D point cloud within an XY-plane corresponding to each of a plurality of faces of the B-rep CAD model within an XYZ-space. The 2D point cloud includes a plurality of discrete 2D data points within the XY-plane. For each of the plurality of faces of the B-rep CAD model, the techniques then determine a concave hull shape for the 2D point cloud through a concave hull algorithm. The techniques then combine the concave hull shape corresponding to each of the plurality of faces of the B-rep CAD model through at least one of a Boolean operation and a stitching operation to obtain a tightest revolve profile of the B-rep CAD model. The techniques then revolve the tightest revolve profile about X-axis of the XYZ-space to obtain a tightest revolve envelope corresponding to the B-rep CAD model.

In light of the above mentioned advantages and the technical advancements provided by the disclosed method and system, the claimed steps as discussed above are not routine, conventional, or well understood in the art, as the claimed steps enable the following solutions to the existing problems in conventional technologies. Further, the claimed steps clearly bring an improvement in the functioning of the device itself as the claimed steps provide a technical solution to a technical problem.

The specification has described method and system for generating tightest revolve envelope for a B-rep CAD model. The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope and spirit of disclosed embodiments being indicated by the following claims.

What is claimed is:

1. A method for generating tightest revolve envelope for a Boundary representation (B-rep) Computer-Aided Design (CAD) model, the method comprising:
   receiving, by an envelope generating device, a 2-dimensional (2D) point cloud within an XY-plane corresponding to each of a plurality of faces of the B-rep CAD model within an XYZ-space, wherein the 2D point cloud comprises a plurality of discrete 2D data points within the XY-plane;
   for each of the plurality of faces of the B-rep CAD model, determining, by the envelope generating device, a concave hull shape for the 2D point cloud through a concave hull algorithm;
   combining, by the envelope generating device, the concave hull shape corresponding to each of the plurality of faces of the B-rep CAD model through at least one of a Boolean operation and a stitching operation to obtain a tightest revolve profile of the B-rep CAD model; and
   revolving, by the envelope generating device, the tightest revolve profile about X-axis of the XYZ-space to obtain a tightest revolve envelope corresponding to the B-rep CAD model.

2. The method of claim 1, further comprising:
   receiving the B-rep CAD model along a first orientation within an XYZ-space from a user;
   realigning the B-rep CAD model from the first orientation to a second orientation along the X-axis of the XYZ-space; and
   generating a 3-dimensional (3D) point cloud for each of the plurality of faces of the B-rep CAD model along the second orientation, wherein the 3-dimensional point cloud comprises a plurality of discrete 3D data points within the XYZ-space.

3. The method of claim 2, further comprising identifying one or more void regions within the B-rep CAD model having no role in the generation of the tightest revolve envelope of the B-rep CAD model, wherein the one or more void regions comprise a set of void discrete points, and wherein the set of void discrete points is not a part of the plurality of 3D data points.

4. The method of claim 2, further comprising transforming the 3D point cloud into the 2D point cloud through a radial projection of the plurality of discrete 3D data points within the XYZ-space upon the XY-plane to obtain the plurality of discrete 2D data points.

5. The method of claim 2, further comprising realigning the tightest revolve envelope along the first orientation within the XYZ space of the B-rep CAD model.

6. The method of claim 1, wherein determining the concave hull shape for the 2D point cloud further comprises:
   for each of the plurality of faces of the B-rep CAD model, identifying a set of boundary points of the 2D point cloud through the concave hull algorithm, wherein the set of boundary points is a part of the plurality of discrete 2D data points; and
   estimating a concave hull shape based on the set of boundary points.

7. The method of claim 6, further comprising, for each of the set of boundary points, connecting a boundary point with an adjacent boundary point through a curve fitting technique based on a relaxed curvature continuity criterion.

8. The method of claim 1, further comprising:
   identifying one or more open regions in the tightest revolve profile of the B-rep CAD model; and
   joining each of the one or more open regions appropriately in the tightest revolve profile of the B-rep CAD model through a line segment to obtain the tightest revolve profile of the B-rep CAD model.

9. A system for generating tightest revolve envelope for a Computer-Aided Design (CAD) Boundary representation (B-rep) model, the system comprising:
   a processor; and
   a memory communicatively coupled to the processor, wherein the memory stores processor instructions, which when executed by the processor, cause the processor to:
      receive a 2-dimensional (2D) point cloud within an XY-plane corresponding to each of a plurality of faces of the B-rep CAD model within an XYZ-space, wherein the 2D point cloud comprises a plurality of discrete 2D data points within the XY-plane;
      for each of the plurality of faces of the B-rep CAD model, determine a concave hull shape for the 2D point cloud through a concave hull algorithm;
      combine the concave hull shape corresponding to each of the plurality of faces of the B-rep CAD model through at least one of a Boolean operation and a stitching operation to obtain a tightest revolve profile of the B-rep CAD model; and
      revolve the tightest revolve profile about X-axis of the XYZ-space to obtain a tightest revolve envelope corresponding to the B-rep CAD model.

10. The system of claim 9, wherein the processor instructions, on execution, further cause the processor to:
    receive the B-rep CAD model along a first orientation within an XYZ-space from a user;
    realign the B-rep CAD model from the first orientation to a second orientation along the X-axis of the XYZ-space; and
    generate a 3-dimensional (3D) point cloud for each of the plurality of faces of the B-rep CAD model along the second orientation, wherein the 3-dimensional point cloud comprises a plurality of discrete 3D data points within the XYZ-space.

11. The system of claim 10, wherein the processor instructions, on execution, further cause the processor to identify one or more void regions within the B-rep CAD model having no role in the generation of the tightest revolve envelope of the B-rep CAD model, wherein the one or more void regions comprise a set of void discrete points, and wherein the set of void discrete points is not a part of the plurality of 3D data points.

12. The system of claim 10, wherein the processor instructions, on execution, further cause the processor to transform the 3D point cloud into the 2D point cloud through a radial projection of the plurality of discrete 3D data points within the XYZ-space upon the XY-plane to obtain the plurality of discrete 2D data points.

13. The system of claim 10, wherein the processor instructions, on execution, further cause the processor to realign the tightest revolve envelope along the first orientation within the XYZ space of the B-rep CAD model.

14. The system of claim 9, wherein to determine the concave hull shape for the 2D point cloud, the processor instructions, on execution, further cause the processor to:
for each of the plurality of faces of the B-rep CAD model,
identifying a set of boundary points of the 2D point cloud through the concave hull algorithm, wherein the set of boundary points is a part of the plurality of discrete 2D data points; and
estimating a concave hull shape based on the set of boundary points.

15. The system of claim 14, wherein the processor instructions, on execution, further cause the processor to, for each of the set of boundary points, connect a boundary point with an adjacent boundary point through a curve fitting technique based on a relaxed curvature continuity criterion.

16. The system of claim 9, wherein the processor instructions, on execution, further cause the processor to:
identify one or more open regions in the tightest revolve profile of the B-rep CAD model; and
join each of the one or more open regions appropriately in the tightest revolve profile of the B-rep CAD model through a line segment to obtain the tightest revolve profile of the B-rep CAD model.

17. A non-transitory computer-readable medium storing computer-executable instructions for generating tightest revolve envelope for a Boundary representation (B-rep) Computer-Aided Design (CAD) model, the computer-executable instructions configured for:
receiving a 2-dimensional (2D) point cloud within an XY-plane corresponding to each of a plurality of faces of the B-rep CAD model within an XYZ-space, wherein the 2D point cloud comprises a plurality of discrete 2D data points within the XY-plane;
for each of the plurality of faces of the B-rep CAD model, determining a concave hull shape for the 2D point cloud through a concave hull algorithm;
combining the concave hull shape corresponding to each of the plurality of faces of the B-rep CAD model through at least one of a Boolean operation and a stitching operation to obtain a tightest revolve profile of the B-rep CAD model; and
revolving the tightest revolve profile about X-axis of the XYZ-space to obtain a tightest revolve envelope corresponding to the B-rep CAD model.

18. The non-transitory computer-readable medium of claim 17, wherein the computer-executable instructions are further configured for:
receiving the B-rep CAD model along a first orientation within an XYZ-space from a user;
realigning the B-rep CAD model from the first orientation to a second orientation along the X-axis of the XYZ-space; and
generating a 3-dimensional (3D) point cloud for each of the plurality of faces of the B-rep CAD model along the second orientation, wherein the 3-dimensional point cloud comprises a plurality of discrete 3D data points within the XYZ-space.

19. The non-transitory computer-readable medium of claim 18, wherein the computer-executable instructions are further configured for identifying one or more void regions within the B-rep CAD model having no role in the generation of the tightest revolve envelope of the B-rep CAD model, wherein the one or more void regions comprise a set of void discrete points, and wherein the set of void discrete points is not a part of the plurality of 3D data points.

20. The non-transitory computer-readable medium of claim 18, wherein the computer-executable instructions are further configured for transforming the 3D point cloud into the 2D point cloud through a radial projection of the plurality of discrete 3D data points within the XYZ-space upon the XY-plane to obtain the plurality of discrete 2D data points.

* * * * *